(12) United States Patent
Yamamoto et al.

(10) Patent No.: US 7,947,895 B2
(45) Date of Patent: May 24, 2011

(54) PHOTOVOLTAIC DEVICE

(75) Inventors: Takeshi Yamamoto, Hirakata (JP); Eiji Maruyama, Katano (JP); Yukihiro Yoshimine, Koube (JP)

(73) Assignee: Sanyo Electric Co., Ltd., Osaka (JP)

(*) Notice: Subject to any disclaimer, the term of this patent is extended or adjusted under 35 U.S.C. 154(b) by 1173 days.

(21) Appl. No.: 10/807,190

(22) Filed: Mar. 24, 2004

(65) Prior Publication Data

US 2005/0126625 A1 Jun. 16, 2005

(30) Foreign Application Priority Data

Dec. 10, 2003 (JP) .................... 2003-412261

(51) Int. Cl.
*H01L 31/00* (2006.01)
(52) U.S. Cl. ............... 136/256; 136/258; 257/E31.126
(58) Field of Classification Search ........... 136/256, 136/258; 257/E31.126
See application file for complete search history.

(56) References Cited

U.S. PATENT DOCUMENTS

| | | | |
|---|---|---|---|
| 4,746,962 A * | 5/1988 | Yamazaki | 257/53 |
| 6,133,522 A * | 10/2000 | Kataoka et al. | 136/259 |
| 6,297,443 B1 * | 10/2001 | Nakajima et al. | 136/258 |
| 6,703,130 B2 | 3/2004 | Ogura et al. | |
| 2001/0005053 A1 * | 6/2001 | Kitae et al. | 257/736 |
| 2001/0008295 A1 * | 7/2001 | Sakata et al. | 257/436 |
| 2001/0016253 A1 * | 8/2001 | Goda et al. | 428/212 |
| 2001/0029978 A1 | 10/2001 | Nakai et al. | |
| 2001/0045505 A1 * | 11/2001 | Morizane et al. | 250/200 |
| 2002/0117667 A1 | 8/2002 | Sugawara et al. | |
| 2003/0170449 A1 * | 9/2003 | Kloppel et al. | 428/336 |

FOREIGN PATENT DOCUMENTS

| | | |
|---|---|---|
| EP | 0 537 730 A2 | 4/1993 |
| EP | 0 681 335 A1 | 11/1995 |
| JP | 58-56479 * | 4/1983 |
| JP | 03-38069 | 2/1991 |
| JP | 4-130871 | 5/1992 |
| JP | 05-110124 | 4/1993 |
| JP | 06-151913 | 5/1994 |
| JP | 11-053942 | 2/1999 |
| JP | 2001-237448 | 8/2001 |
| JP | 2002-305212 | 10/2002 |
| JP | 2003-86025 | 3/2003 |
| JP | 2003-197943 | 7/2003 |

(Continued)

OTHER PUBLICATIONS

"Making Epoxy Resins" by http://pslc.ws/macrog/eposyn.htm; Jun. 12, 2002.*

(Continued)

*Primary Examiner* — Basia Ridley
*Assistant Examiner* — Thanh-Truc Trinh
(74) *Attorney, Agent, or Firm* — McDermott Will & Emery LLP

(57) ABSTRACT

A photovoltaic device capable of suppressing reduction of the yield in production also when a transparent conductive film has small surface roughness is obtained. This photovoltaic device comprises a photovoltaic element including a transparent conductive oxide film having arithmetic mean deviation of the profile of not more than about 2 nm and a paste electrode, formed on the transparent conductive oxide film, containing at least a metal material and a resin material, while the resin material contains at least about 60 percent by weight and not more than about 100 percent by weight of epoxy resin.

6 Claims, 6 Drawing Sheets

FOREIGN PATENT DOCUMENTS

JP 2003-347564 12/2003

OTHER PUBLICATIONS

Kawamoto, Kunihlro, et al. "High Efficiency HIT Solar Cell," Material and Devices Development Center, Sanyo Tchnical Review, vol. 34, No. 1 Jun. 2002, pp. 111-117.

Japanese Office Action, with English Translation, issued in Japanese Patent Application No. JP 2003-412261 dated on Jul. 1, 2008.

Japanese Office Action, with English Translation, issued in Japanese Patent Application No. JP 2003-412261, dated Nov. 11, 2008.

Chinese Office Action, w/ English translation thereof, issued in Chinese Patent Application No. 2004100316316 dated on Aug. 29, 2008.

\* cited by examiner

PYRAMIDAL IRREGULARITIES

PHOTOVOLTAIC DEVICE

BACKGROUND OF THE INVENTION

1. Field of the Invention

The present invention relates to a photovoltaic device, and more particularly, it relates to a photovoltaic device comprising a photovoltaic element including a transparent conductive oxide film and a paste electrode formed thereon.

2. Description of the Background Art

A photovoltaic element having a structure obtained by inserting a substantially intrinsic amorphous semiconductor layer between a fist conductivity type crystalline semiconductor layer and a second conductivity type amorphous semiconductor layer thereby improving junction characteristics and comprising a transparent conductive oxide film formed on the second conductivity type amorphous semiconductor layer and a paste electrode formed thereon is known in general. For example, Japanese Patent Laying-Open No. 2003-197943 discloses this type of photovoltaic element.

According to the structure of the aforementioned photovoltaic element disclosed in Japanese Patent Laying-Open No. 2003-197943, amorphous semiconductor layers can be formed by plasma CVD at a low temperature of not more than about 200° C. When the photovoltaic element is formed through such a low-temperature process, a paste electrode is formed on a transparent conductive oxide film with low-temperature fired paste hardenable by firing at a temperature of not more than about 200° C.

In the structure of the aforementioned photovoltaic element disclosed in Japanese Patent Laying-Open No. 2003-197943, however, relatively small adhesiveness of the low-temperature fired paste to the transparent conductive oxide film may reduce adhesiveness of the paste electrode to the transparent conductive oxide film. If external force is applied to the paste electrode through an electric wire when a photovoltaic device (photovoltaic module) is prepared by connecting a plurality of photovoltaic elements having such paste electrodes with each other through the electric wire, therefore, the electric wire and the paste electrode may separate from the transparent conductive oxide film of the photovoltaic element. Consequently, the yield in production of the photovoltaic device is disadvantageously reduced.

SUMMARY OF THE INVENTION

The present invention has been proposed in order to solve the aforementioned problem, and an object of the present invention is to provide a photovoltaic device capable of suppressing reduction of the yield in production also when a transparent conductive film has small surface roughness.

In order to attain the aforementioned object, a photovoltaic device according to a first aspect of the present invention comprises a photovoltaic element including a transparent conductive oxide film having Arithmetic Mean Deviation of the Profile of not more than about 2 nm and a paste electrode, formed on the transparent conductive oxide film, containing at least a metal material and a resin material, while the resin material contains at least about 60 percent by weight and not more than about 100 percent by weight of epoxy resin.

In the photovoltaic device according to the first aspect, as hereinabove described, the paste electrode containing the resin material containing at least about 60 percent by weight and not more than about 100 percent by weight of epoxy resin is formed on the transparent conductive oxide film having the arithmetic mean deviation of the profile of not more than about 2 nm so that the paste electrode containing at least about 60 percent by weight of epoxy resin having high adhesiveness can excellently adhere to the transparent conductive oxide film also when the adhesiveness of the paste electrode with respect to the transparent conductive oxide film is reduced due to the small arithmetic mean deviation of the profile of not more than about 2 nm. Thus, the paste electrode can be inhibited from separating from the transparent conductive oxide film also when external force is applied to the paste electrode of the photovoltaic element in production of the photovoltaic device. Consequently, the yield in production of the photovoltaic device can be inhibited from reduction despite the small arithmetic mean deviation of the profile of not more than about 2 nm of the transparent conductive oxide film. Further, the paste electrode is so excellently adherable to the transparent conductive oxide film that the paste electrode can be inhibited from separating from the transparent conductive oxide film also when the photovoltaic device is used over a long period. Consequently, the reliability of the photovoltaic device can be improved not only in production of the photovoltaic device but also over a long period. The arithmetic mean deviation of the profile of the transparent conductive oxide film is so set to the small value of not more than about 2 nm that light absorption and resistance of the transparent conductive oxide film can be reduced, whereby the output characteristic of the photovoltaic element can be improved. Consequently, the output characteristic of the photovoltaic device can be improved.

In the aforementioned photovoltaic device according to the first aspect, the photovoltaic element preferably includes a first conductivity type crystalline semiconductor layer and a substantially intrinsic non-single-crystalline semiconductor layer formed on the crystalline semiconductor layer, and the transparent conductive oxide film is preferably formed on the non-single-crystalline semiconductor layer. According to this structure, the photovoltaic device comprising the photovoltaic element having the structure obtained by forming the substantially intrinsic non-single-crystalline semiconductor layer on the first conductivity type crystalline semiconductor layer can be improved in output characteristic while suppressing reduction of the yield in production despite the small surface roughness of the transparent conductive oxide film. The term "non-single-crystalline semiconductor" indicates a wide concept including not only an amorphous semiconductor but also a microcrystalline semiconductor.

In this case, the photovoltaic element preferably includes a second conductivity type non-single-crystalline semiconductor layer formed on the substantially intrinsic non-single-crystalline semiconductor layer, and the transparent conductive oxide film is preferably formed on the second conductivity type non-single-crystalline semiconductor layer. According to this structure, the photovoltaic device comprising the photovoltaic element obtained by successively forming the substantially intrinsic non-single-crystalline semiconductor layer and the second conductivity type non-single-crystalline semiconductor layer on the first conductivity type crystalline semiconductor layer can be improved in output characteristic while suppressing reduction of the yield in production despite the small surface roughness of the transparent conductive oxide film.

In the aforementioned structure including the first conductivity type crystalline semiconductor layer, the substantially intrinsic non-single-crystalline semiconductor layer and the transparent conductive oxide film, the substantially intrinsic non-single-crystalline semiconductor layer preferably includes a substantially intrinsic first non-single-crystalline semiconductor layer formed on the upper surface of the first conductivity type crystalline semiconductor layer and a substantially intrinsic second non-single-crystalline semiconductor layer formed on the lower surface of the first conductivity type crystalline semiconductor layer, the photovoltaic element preferably includes a second conductivity type third non-single-crystalline semiconductor layer formed on the upper surface of the first non-single-crystalline semiconductor layer and a first conductivity type fourth non-single-crystalline semiconductor layer formed on the lower surface of the second non-single-crystalline semiconductor layer, and the transparent conductive oxide film preferably includes a first transparent conductive oxide film formed on the upper surface of the third non-single-crystalline semiconductor layer and a second transparent conductive oxide film formed on the lower surface of the fourth non-single-crystalline semiconductor layer. According to this structure, the photovoltaic device comprising the photovoltaic element obtained by successively forming the substantially intrinsic first non-single-crystalline semiconductor layer, the second conductivity type third non-single-crystalline semiconductor layer and the first transparent conductive oxide film on the upper surface of the first conductivity type crystalline semiconductor layer while successively forming the substantially intrinsic second non-single-crystalline semiconductor layer, the first conductivity type fourth non-single-crystalline semiconductor layer and the second transparent conductive oxide film on the lower surface of the first conductivity type crystalline semiconductor layer can be improved in output characteristic while suppressing reduction of the yield in production despite the small surface roughness of the first and second transparent conductive oxide films.

In the aforementioned photovoltaic device according to the first aspect, the resin material constituting the paste electrode preferably contains at least about 75 percent by weight and not more than about 100 percent by weight of epoxy resin. According to this structure, the paste electrode can further excellently adhere to the transparent conductive oxide film. Thus, the paste electrode can be further inhibited from separating from the transparent conductive oxide film, whereby the yield in production of the photovoltaic device can be further inhibited from reduction. The paste electrode is so further excellently adherable to the transparent conductive oxide film that the paste electrode can be further inhibited from separating from the transparent conductive oxide film also when the photovoltaic device is used over a long period. Consequently, the reliability of the photovoltaic device can be further improved not only in production but also over a long period.

In the aforementioned photovoltaic device according to the first aspect, the transparent conductive oxide film preferably has arithmetic mean deviation of the profile of at least about 0.5 nm and not more than about 1 nm. According to this structure, the light absorption and the resistance of the transparent conductive oxide film can be further reduced due to the smaller arithmetic mean deviation of the profile of at least about 0.5 nm and not more than about 1 nm, whereby the output characteristic of the photovoltaic element can be further improved.

In the aforementioned photovoltaic device according to the first aspect, the transparent conductive oxide film preferably contains $SnO_2$-added $In_2O_3$. According to this structure, the photovoltaic element including the transparent conductive oxide film consisting of ITO (indium tin oxide), which is $SnO_2$-added $In_2O_3$, can be inhibited from reduction of the yield in production despite the small surface roughness of the transparent conductive oxide film.

In this case, the content of Sn in the transparent conductive oxide film is preferably not more than about 5 percent by weight. According to this structure, light transmittance of the transparent conductive oxide film can be improved.

In the aforementioned photovoltaic device according to the first aspect, the resin material constituting the paste electrode preferably contains urethane resin in addition to the epoxy resin. According to this structure, elasticity of the paste electrode can be improved due to the elastic urethane resin. Thus, residual stress caused in the paste electrode can be reduced when the paste electrode is hardened by firing. Consequently, the residual stress of the paste electrode can be reduced with the urethane resin while improving adhesiveness with the epoxy resin contained by at least about 60 percent by weight. Further, the resin material containing the urethane resin is so softened that the paste electrode can be easily formed on the transparent conductive oxide film by screen printing or the like.

In the aforementioned photovoltaic device according to the first aspect, the metal material constituting the paste electrode is preferably Ag. According to this structure, the photovoltaic device comprising the photovoltaic element employing the paste electrode containing Ag as the metal material can be inhibited from reduction of the yield in production despite the small surface roughness of the transparent conductive oxide film.

In the aforementioned photovoltaic device according to the first aspect, the contact angle of water with respect to the surface of the transparent conductive oxide film is preferably at least about 40° and not more than about 74°. According to this structure, the paste electrode can excellently adhere to the transparent conductive oxide film due to the epoxy resin contained therein by at least about 60 percent by weight also when the adhesiveness of the paste electrode with respect to the surface of the transparent conductive oxide film is reduced due to reduction of wettability on the surface of the transparent conductive oxide film resulting from the large contact angle of water of at least about 40° and not more than about 74° with respect to the surface of the transparent conductive oxide film.

In the aforementioned photovoltaic device according to the first aspect, a plurality of photovoltaic elements are preferably provided at a prescribed interval, the paste electrode preferably includes a first paste electrode formed on the upper surface of each photovoltaic element and a second paste electrode formed on the lower surface of each photovoltaic element, and the photovoltaic device preferably further comprises an electric wire having a first end connected to the first paste electrode formed on the upper surface of a prescribed photovoltaic element and a second end connected to the second paste electrode formed on the lower surface of another photovoltaic element adjacent to the prescribed photovoltaic element. According to this structure, the photovoltaic device comprising the plurality of photovoltaic elements connected with each other through the electric wire can be inhibited from reduction of the yield in production despite the small surface roughness of the transparent conductive oxide film.

A photovoltaic device according to a second aspect of the present invention comprises a photovoltaic element including a transparent conductive oxide film provided with a surface having a contact angle of at least about 40° and not more than about 74° with respect to water and a paste electrode, formed on the transparent conductive oxide film, containing at least a metal material and a resin material, while the resin material contains at least about 60 percent by weight and not more than about 100 percent by weight of epoxy resin.

In the photovoltaic device according to the second aspect, as hereinabove described, the paste electrode containing the resin material containing at least about 60 percent by weight and not more than about 100 percent by weight of the epoxy resin is formed on the transparent conductive oxide film provided with the surface having the contact angle of at least about 40° and not more than about 74° with respect to water so that the paste electrode containing at least about 60 percent by weight of the epoxy resin having high adhesiveness can excellently adhere to the transparent conductive oxide film also when the adhesiveness of the paste electrode with respect to the transparent conductive oxide film is reduced due to reduction of wettability on the surface of the transparent conductive oxide film resulting from the large contact angle of at least about 40° and not more than about 74° with respect to water. Thus, the paste electrode can be inhibited from separating from the transparent conductive oxide film also when external force is applied to the paste electrode of the photovoltaic element in production of the photovoltaic device. Consequently, the yield in production of the photovoltaic device can be inhibited from reduction also when the adhesiveness of the paste electrode with respect to the transparent conductive oxide film is reduced due to the contact angle of water of at least about 40° and not more than about 74° with respect to the surface of the transparent conductive oxide film.

In the aforementioned photovoltaic device according to the second aspect, the photovoltaic element preferably includes a first conductivity type crystalline semiconductor layer and a substantially intrinsic non-single-crystalline semiconductor layer formed on the crystalline semiconductor layer, and the transparent conductive oxide film is preferably formed on the non-single-crystalline semiconductor layer. According to this structure, the photovoltaic device comprising the photovoltaic element having the structure obtained by forming the substantially intrinsic non-single-crystalline semiconductor layer on the first conductivity type crystalline semiconductor layer can be improved in output characteristic while suppressing reduction of the yield in production also hen the transparent conductive oxide film has small surface roughness.

In this case, the photovoltaic element preferably includes a second conductivity type non-single-crystalline semiconductor layer formed on the substantially intrinsic non-single-crystalline semiconductor layer, and the transparent conductive oxide film is preferably formed on the second conductivity type non-single-crystalline semiconductor layer. According to this structure, the photovoltaic device comprising the photovoltaic element obtained by successively forming the substantially intrinsic non-single-crystalline semiconductor layer and the second conductivity type non-single-crystalline semiconductor layer on the first conductivity type crystalline semiconductor layer can be improved in output characteristic while suppressing reduction of the yield in production also when the transparent conductive oxide film has small surface roughness.

In the aforementioned structure including the first conductivity type crystalline semiconductor layer, the substantially intrinsic non-single-crystalline semiconductor layer and the transparent conductive oxide film, the substantially intrinsic non-single-crystalline semiconductor layer preferably includes a substantially intrinsic first non-single-crystalline semiconductor layer formed on the upper surface of the first conductivity type crystalline semiconductor layer and a substantially intrinsic second non-single-crystalline semiconductor layer formed on the lower surface of the first conductivity type crystalline semiconductor layer, the photovoltaic element preferably includes a second conductivity type third non-single-crystalline semiconductor layer formed on the upper surface of the first non-single-crystalline semiconductor layer and a first conductivity type fourth non-single-crystalline semiconductor layer formed on the lower surface of the second non-single-crystalline semiconductor layer, and the transparent conductive oxide film preferably includes a first transparent conductive oxide film formed on the upper surface of the third non-single-crystalline semiconductor layer and a second transparent conductive oxide film formed on the lower surface of the fourth non-single-crystalline semiconductor layer. According to this structure, the photovoltaic device comprising the photovoltaic element obtained by successively forming the substantially intrinsic first non-single-crystalline semiconductor layer, the second conductivity type non-single-crystalline semiconductor layer and the first transparent conductive oxide film on the first conductivity type crystalline semiconductor layer while successively forming the substantially intrinsic second non-single-crystalline semiconductor layer, the first conductivity type fourth non-single-crystalline semiconductor layer and the second transparent conductive oxide film on the lower surface of the first conductivity type crystalline semiconductor layer can be improved in output characteristic while suppressing reduction of the yield in production also when the first and second transparent conductive oxide films have small surface roughness.

In the aforementioned photovoltaic device according to the second aspect, the resin material constituting the paste electrode preferably contains at least about 75 percent by weight and not more than about 100 percent by weight of the epoxy resin. According to this structure, the paste electrode can further excellently adhere to the transparent conductive oxide film. Thus, the paste electrode can be further inhibited from separating from the transparent conductive oxide film, whereby the yield of the photovoltaic device in production can be further inhibited from reduction. The paste electrode can so further excellently adhere to the transparent conductive oxide film that the paste electrode can be further inhibited from separating from the transparent conductive oxide film also when the photovoltaic device is used over a long period. Consequently, the reliability of the photovoltaic device can be improved not only in production but also over a long period.

In the aforementioned photovoltaic device according to the second aspect, the transparent conductive oxide film preferably contains $SnO_2$-added $In_2O_3$. According to this structure, the photovoltaic element including the transparent conductive oxide film consisting of ITO (indium tin oxide), which is $SnO_2$-added $In_2O_3$, can be inhibited from reduction of the yield in production also when the transparent conductive oxide film has small surface roughness.

In this case, the content of Sn in the transparent conductive oxide film is preferably not more than about 5 percent by weight. According to this structure, light transmittance of the transparent conductive oxide film can be improved.

In the aforementioned photovoltaic device according to the second aspect, the resin material constituting the paste electrode preferably contains urethane resin in addition to the epoxy resin. According to this structure, elasticity of the paste electrode can be improved due to the elastic urethane resin. Thus, residual stress caused in the paste electrode can be reduced when the paste electrode is hardened by firing. Consequently, the residual stress of the paste electrode can be reduced with the urethane resin while improving adhesiveness with the epoxy resin contained by at least about 60 percent by weight. Further, the resin material containing the urethane resin is so softened that the paste electrode can be easily formed on the transparent conductive oxide film by screen printing or the like.

In the aforementioned photovoltaic device according to the second aspect, the metal material constituting the paste electrode is preferably Ag. According to this structure, the photovoltaic device comprising the photovoltaic element employing the paste electrode containing Ag as the metal material can be inhibited from reduction of the yield in production also when the transparent conductive oxide film has small surface roughness.

In the aforementioned photovoltaic device according to the second aspect, a plurality of photovoltaic elements are preferably provided at a prescribed interval, the paste electrode preferably includes a first paste electrode formed on the upper surface of each photovoltaic element and a second paste electrode formed on the lower surface of each photovoltaic element, and the photovoltaic device preferably further comprises an electric wire having a first end connected to the first paste electrode formed on the upper surface of a prescribed photovoltaic element and a second end connected to the second paste electrode formed on the lower surface of another photovoltaic element adjacent to the prescribed photovoltaic element. According to this structure, the photovoltaic device comprising the plurality of photovoltaic elements connected with each other through the electric wire can be inhibited from reduction of the yield in production also when the transparent conductive oxide film has small surface roughness.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

The structures of a photovoltaic element 1 and a photovoltaic module (photovoltaic device) 11 employing the same according to this embodiment are described with reference to FIGS. 1 to 4.

Figure 1:
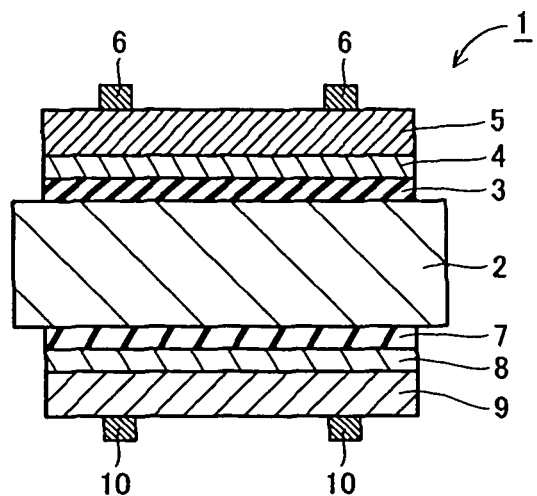
FIG. 1 is a sectional view showing the structure of a photovoltaic element according to an embodiment of the present invention.
Figure 2:
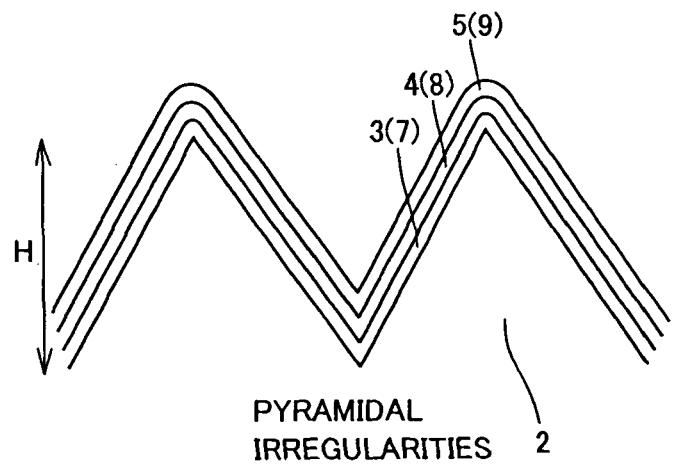
FIG. 2 is a sectional view showing a structure around the surface of a single-crystalline silicon substrate of the photovoltaic element according to the embodiment shown in FIG. 1.

As shown in FIG. 1, the photovoltaic element 1 according to this embodiment comprises an n-type single-crystalline silicon substrate 2 having resistivity of about 1Ω·cm and a thickness of about 300 μm with a (100) plane (hereinafter simply referred to as "n-type single-crystalline silicon substrate 2). The n-type single-crystalline silicon substrate 2 is an example of the "first conductivity type crystalline semiconductor layer" in the present invention. Pyramidal irregularities having a height H of several μm to several 10 μm are formed on the surface of the n-type single-crystalline silicon substrate 2, as shown in FIG. 2. A substantially intrinsic i-type amorphous silicon layer 3 having a thickness of about 5 nm is formed on the upper surface of the n-type single-crystalline silicon substrate 2. The i-type amorphous silicon layer 3 is an example of the "substantially intrinsic non-single-crystalline semiconductor layer" or the "first non-single-crystalline semiconductor layer" in the present invention. A p-type amorphous silicon layer 4 having a thickness of about 5 nm is formed on the i-type amorphous silicon layer 3. The p-type amorphous silicon layer 4 is an example of the "second conductivity type non-single-crystalline semiconductor layer" or the "third non-single-crystalline semiconductor layer" in the present invention.

Figure 3:
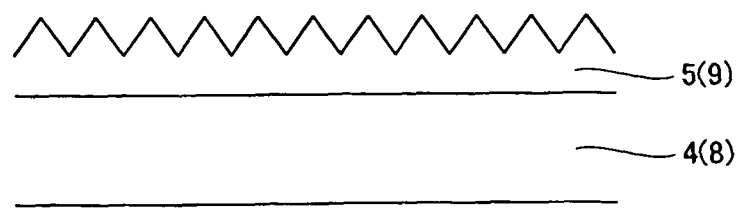
FIG. 3 is an enlarged sectional view showing the structure of an ITO film of the photovoltaic element according to the embodiment shown in FIG. 1.

An ITO film 5 having a thickness of about 100 nm is formed on the p-type amorphous silicon layer 4. This ITO film 5 is an example of the "transparent conductive oxide film" or the "first transparent conductive oxide film" in the present invention. The ITO film 5 is formed by $SnO_2$-added $In_2O_3$. In order to improve light transmittance of the ITO film 5, the Sn content in the ITO film 5 is preferably set to not more than about 5 percent by weight, more preferably to not more than about 2 percent by weight. Irregularities of about 0.5 nm to about 4 nm in size are formed on the surface of the ITO film 5, as shown in FIG. 3. Thus, the ITO film 5 has arithmetic mean deviation of the profile (Ra) of at least about 0.5 nm and not more than about 2 nm. The arithmetic mean deviation of the profile (Ra) is defined according to Japanese Industrial Standards (JIS B 0601-1994). The contact angle of water with respect to the surface of the ITO film 5 having the arithmetic mean deviation of the profile (Ra) of at leas about 0.5 nm and not more than about 2 nm is at least about 40 and not more than about 74°.

Paste electrodes 6 are formed on prescribed regions of the upper surface of the ITO film 5. The paste electrodes 6 are examples of the "first paste electrode" in the present invention. These paste electrodes 6 are made of silver (Ag) and a resin binder. This silver is an example of the "metal material" in the present invention, and the resin binder is an example of the "resin material" in the present invention. The resin binder constituting the paste electrodes 6 contains epoxy resin, and the content of the epoxy resin in the resin binder is at least about 60 percent by weight and not more than about 100 percent by weight. When the content of the epoxy resin in the resin binder is less than 100 percent by weight, the remaining part of the resin binder is entirely made of urethane resin.

Another substantially intrinsic i-type amorphous silicon layer 7 having a thickness of about 5 nm is formed on the lower surface of the n-type single-crystalline silicon substrate 2. This i-type amorphous silicon layer 7 is an example of the "substantially intrinsic non-single-crystalline semiconductor layer" or the "second non-single-crystalline semiconductor layer" in the present invention. Another n-type amorphous silicon layer 8 having a thickness of about 20 nm is formed on the i-type amorphous silicon layer 7. This n-type amorphous silicon layer 8 is an example of the "fourth non-single-crystalline semiconductor layer" in the present invention. Thus, the i-type amorphous silicon layer 7 and the n-type amorphous silicon layer 8 are successively formed on the lower surface of the n-type single-crystalline silicon substrate 2, thereby forming the so-called BSF (back surface field) structure. Another ITO film 9 having a thickness of about 100 nm is formed on the n-type amorphous silicon layer 8. This ITO film 9 is an example of the "transparent conductive oxide film" or the "second transparent conductive oxide film" in the present invention. Other paste electrodes 10 are formed on prescribed regions of the ITO film 9. The paste electrodes 10 are examples of the "second paste electrode" in the present invention. The remaining structures of the i-type amorphous silicon layer 7, the n-type amorphous silicon layer 8, the ITO film 9 and the paste electrodes 10 formed on the lower surface of the n-type single-crystalline silicon substrate 2 are similar to those of the i-type amorphous silicon layer 3, the p-type amorphous silicon layer 4, the ITO film 5 and the paste electrodes 6 formed on the upper surface of the n-type single-crystalline silicon substrate 2 respectively.

Figure 4:
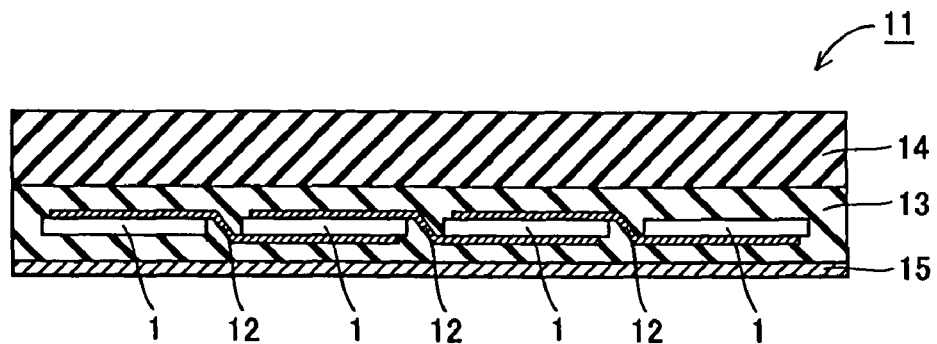
FIG. 4 is a sectional view showing the structure of a photovoltaic module employing the photovoltaic element according to the embodiment shown in FIG. 1.

As shown in FIG. 4, the photovoltaic module 11 employing the photovoltaic element 1 according to this embodiment comprises a plurality of photovoltaic elements 1. Each of the plurality of photovoltaic elements 1 is serially connected with adjacent photovoltaic elements 1 through tabs 12 consisting of flat copper foil. The tabs 12 are examples of the "electric wire" in the present invention. A first end of each tab 12 is connected to the paste electrodes 6 (see FIG. 1) provided on the upper surface of a prescribed photovoltaic element 1 while a second end thereof is connected to the paste electrodes 10 (see FIG. 1) provided on the lower surface of another photovoltaic element 1 adjacent to the prescribed photovoltaic element 1. A filler 13 of EVA (ethylene vinyl acetate) covers the plurality of photovoltaic elements 1 connected with each other through the tabs 12. A surface protective member 14 consisting of a glass substrate is provided on the upper surface of the filer 13. A back surface protective member 15 consisting of a three-layer structure of PET (polyethylene terephthalate), aluminum foil and PET is provided on the lower surface of the filler 13.

A process of fabricating the photovoltaic element 1 and the photovoltaic module 11 employing the same according to this embodiment is described with reference to FIGS. 1 and 4 to 6.

Figure 5:
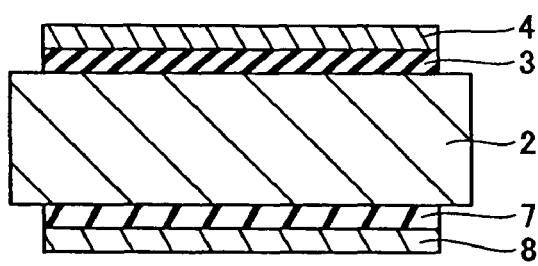
FIGS. 5 and 6 are sectional views for illustrating a process of fabricating the photovoltaic element according to the embodiment of the present invention.

The n-type single-crystalline silicon substrate 2 having the resistivity of about 1 Ω·cm and the thickness of about 300 μm, cleaned for removing impurities, is prepared as shown in FIG. 5. Then, the i-type amorphous silicon layer 3 having the thickness of about 5 nm and the p-type amorphous silicon layer 4 having the thickness of about 5 nm are formed on the upper surface of the n-type single-crystalline silicon substrate 2 in this order by RF plasma CVD. More specifically, the i-type amorphous silicon layer 3 and the p-type amorphous silicon layer 4 are formed by RF plasma CVD under conditions of a frequency of about 13.56 MHz, a formation temperature of about 100° C. to about 250° C., a reaction pressure of about 26.6 Pa to about 80.0 Pa and RF power of about 10 W to about 100 W.

Then, the i-type amorphous silicon layer 7 having the thickness of about 5 nm and the n-type amorphous silicon layer 8 having the thickness of about 20 nm are formed on the lower surface of the n-type single-crystalline silicon substrate 2 in this order. The i-type amorphous silicon layer 7 and the n-type amorphous silicon layer 8 are formed through a process similar to the aforementioned one for the i-type amorphous silicon layer 3 and the p-type amorphous silicon layer 4 respectively.

Figure 6:
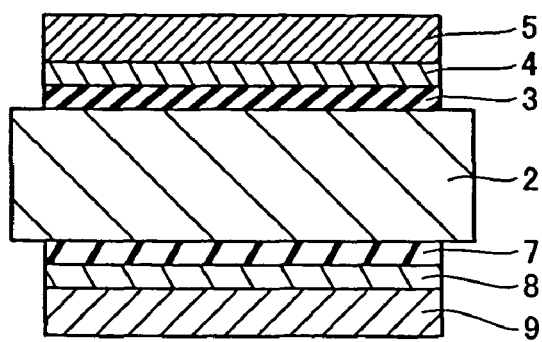

As shown in FIG. 6, The ITO films 5 and 9 having the thicknesses of about 100 nm and the arithmetic mean deviation of the profile (Ra) of at least about 0.5 nm and not more than about 2 nm are formed on the p-type amorphous silicon layer 4 and the n-type amorphous silicon layer 8 respectively by magnetron sputtering. More specifically, the ITO films 5 and 9 are formed under conditions of a formation temperature of about 50° C. to about 250° C., an Ar gas flow rate of about 200 sccm, an $O_2$ gas flow rate of about 50 sccm, power of about 0.5 kW to about 3 kW and magnetic field strength of about 500 G to about 3000 G.

Then, silver paste (low-temperature fired paste) consisting of silver (Ag) and the resin binder (containing epoxy resin and urethane resin at a ratio of about 60 percent by weight/about 40 percent by weight to about 100 percent by weight/about 0 percent by weight) is applied to the prescribed regions of the ITO films 5 and 9 respectively by screen printing and thereafter fired at about 180° C. for about 1 hour to be hardened, thereby forming the paste electrodes 6 and 9. Thus, the photovoltaic element 1 according to this embodiment is formed as shown in FIG. 1.

Then, a plurality of photovoltaic elements 1 are prepared in the aforementioned manner. The first ends of the tabs 12 (see FIG. 4) of copper foil are connected to the paste electrodes 6 provided on the upper surfaces of the plurality of photovoltaic elements 1. At this time, the tabs 12 are soldered to the paste electrodes 6 by heating solder applied to the surfaces of the tabs 12. The second ends of the tabs 12 are connected to the paste electrodes 10 (see FIG. 1) provided on the lower surfaces of the adjacent photovoltaic elements 1 through a process similar to the above. Thus, the plurality of photovoltaic elements 1 are serially connected with each other.

Then, the filler 13 consisting of an EVA sheet is placed on the surface protective member 14 consisting of a glass substrate, and the plurality of photovoltaic elements 1 connected with each other through the tabs 12 are placed thereon. Another filler 13 consisting of an EVA sheet is further placed on the photovoltaic elements 1, and the back surface protective member 15 having the three-layer structure of PET, aluminum foil and PET is placed thereon. Thereafter the surface protective member 14, the fillers 13, the plurality of photovoltaic elements 1 connected with each other through the tabs 12 and the back surface protective member 15 are heated and pressurized, to be integrated with each other. Thus, the photovoltaic module 11 according to this embodiment is formed as shown in FIG. 4.

According to this embodiment, as hereinabove described, the paste electrodes 6 and 10 containing the resin binder containing at least about 60 percent by weight and not more than about 100 percent by weight are formed on the ITO films 5 and 9 having the arithmetic mean deviation of the profile (Ra) of at least about 0.5 nm and not more than about 2 nm respectively. Also when the paste electrodes 6 and 10 are reduced in adhesiveness to the ITO films 5 and 9 due to the small arithmetic mean deviation of the profile (Ra) of at least about 0.5 nm and not more than about 2 nm, therefore, the paste electrodes 6 and 10 containing at least about 60 percent by weight of epoxy resin having high adhesiveness can excellently adhere to the ITO films 5 and 9 respectively. Thus, also when external force is applied to the paste electrodes 6 and 10 through the tabs 12 in production of the photovoltaic module 11 with the photovoltaic elements 1, the paste electrodes 6 and 10 can be inhibited from separating from the ITO films 5 and 9. Consequently, the yield in production of the photovoltaic module 11 can be inhibited from reduction also when the paste electrodes 6 and 10 are reduced in adhesiveness to the ITO films 5 and 9 due to the small arithmetic mean deviation of the profile (Ra) of at least about 0.5 nm and not more than about 2 nm. Further, the paste electrodes 6 and 10 are so excellently adherable to the ITO films 5 and 9 respectively that the same can be inhibited from separating from the ITO films 5 and 9 also when the photovoltaic module 11 is used over a long period. Consequently, the photovoltaic module 11 can be improved in reliability over a long period.

According to this embodiment, further, the ITO film 5 having the arithmetic mean deviation of the profile (Ra) set to the small value of not more than about 2 nm can be reduced in light absorption and resistance, thereby improving the output characteristic of the photovoltaic element 1. Consequently, the output characteristic of the photovoltaic module 11 can be improved.

According to this embodiment, in addition, the resin binder constituting the paste electrodes 6 and 10 contains urethane resin in addition to the epoxy resin so that the urethane resin having high elasticity can improve the elasticity of the paste electrodes 6 and 10. Thus, residual stress caused in the paste electrodes 6 and 10 (silver paste) can be reduced when the paste electrodes 6 and 10 are fired to be hardened. Consequently, the residual stress of the paste electrodes 6 and 10 can be reduced with the urethane resin while improving adhesiveness with the epoxy resin contained by at least about 60 percent by weight. The resin binder containing the urethane resin is so softened that the paste electrodes 6 and 10 can be easily formed on the ITO films 5 and 9 respectively by screen printing or the like.

According to this embodiment, further, the contact angle of water with respect to the surfaces of the ITO films 5 and 9 is set to the large value of at least about 40° and not more than about 74° so that the paste electrodes 6 and 10 containing at least about 60 percent by weight of the epoxy resin having high adhesiveness can excellently adhere to the ITO films 5 and 9 respectively also when the paste electrodes 6 and 10 are reduced in adhesiveness to the surfaces of the ITO films 5 and 9, due to reduction of wettability on the surfaces of the ITO films 5 and 9. Thus, also when external force is applied to the paste electrodes 6 and 10 through the tabs 12 in production of the photovoltaic module 11 with the photovoltaic elements 1, the paste electrodes 6 and 10 and the tabs 12 can be inhibited from separating from the ITO films 5 and 9. Consequently, the yield in production of the photovoltaic module 11 can be inhibited from reduction also when the paste electrodes 6 and 10 are reduced in adhesiveness to the ITO films 5 and 9 due to the large contact angle of water of at least about 40° and not more than 74° with respect to the surfaces of the ITO films 5 and 9.

An experiment made for confirming the aforementioned effects is now described. More specifically, this experiment was made in order to investigate the relation between the surface roughness of an ITO film and the output characteristic of a photovoltaic element and the relation between the surface roughness of the ITO film and adhesiveness of a paste electrode. In this experiment, the photovoltaic element was prepared with a flat n-type single-crystalline silicon substrate including no pyramidal irregularities on its surface. It has been confirmed with a TEM (transmission electron microscope) that irregularities are formed on the surface of an ITO film formed on such a flat n-type single-crystalline silicon substrate similarly to a case of forming an ITO film on an n-type single-crystalline silicon substrate including pyramidal irregularities on its surface.

Figure 7:
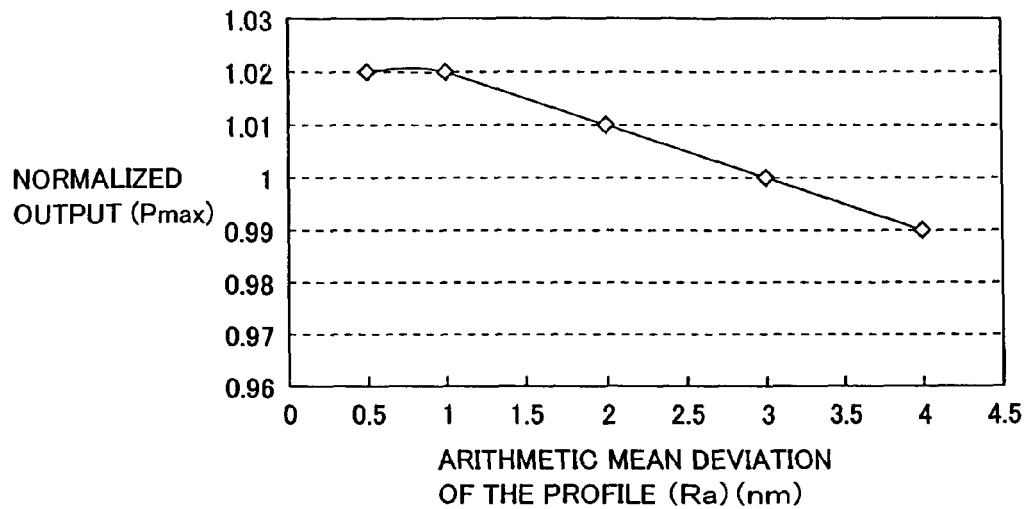
FIG. 7 is a correlation diagram showing the relation between arithmetic mean deviation of the profile (Ra) of the ITO film and a normalized output (Pmax) of the photovoltaic element.

FIG. 7 shows the relation between the arithmetic mean deviation of the profile (Ra) of the ITO film and a normalized output (Pmax) of the photovoltaic element. In this experiment, the ITO film was formed by magnetron sputtering while fixing the flow rates of Ar gas and $O_2$ gas and varying a sputtering voltage from −500 V to −50 V. The composition ratio of epoxy resin to urethane resin contained in a resin binder forming the paste electrode was set to 30 percent by weight/70 percent by weight. The arithmetic mean deviation of the profile (Ra) of the ITO film was measured with an AFM (interatomic force microscope). FIG. 7 shows the normalized output (Pmax) normalized by the output of the photovoltaic element when the arithmetic mean deviation of the profile (Ra) of the ITO film was 3 nm.

Referring to FIG. 7, it is understood that the normalized output (Pmax) is increased from 0.99 to 1.02 as the arithmetic mean deviation of the profile (Ra) of the ITO film is reduced from 4 nm to 0.5 nm. Thus, it is understood that the output characteristic of the photovoltaic element is improved as the arithmetic mean deviation of the profile (Ra) of the ITO film is reduced. This improvement of the output characteristic results from increase of a short-circuit current (Isc) and a fill factor (F.F.). The output characteristic of the photovoltaic element was improved as described above conceivably for the following reason: The light absorption and the resistance of the ITO film are reduced as the arithmetic mean deviation of the profile (Ra) of the ITO film is reduced. Thus, the short-circuit current (Isc) and the fill factor (F.F.) of the photovoltaic element are so increased as to conceivably improve the output characteristic (normalized output Pmax) of the photovoltaic element.

It is also understood that the output characteristic (Pmax: 1.01) of the photovoltaic element is improved by 1% when the arithmetic mean deviation of the profile (Ra) of the ITO film is 2 nm as compared with the output characteristic (Pmax: 1) of the photovoltaic element observed when the arithmetic mean deviation of the profile (Ra) is 3 nm. It is further understood that the output characteristic (Pmax: 1.02) of the photovoltaic element is improved by 2% when the arithmetic mean deviation of the profile (Ra) of the ITO film is at least 0.5 nm and not more than 1 nm as compared with the output characteristic (Pmax: 1) of the photovoltaic element observed when the arithmetic mean deviation of the profile (Ra) is 3 nm. Thus, it has been proved that the arithmetic mean deviation of the profile (Ra) of the ITO film is preferably set to at least 0.5 nm and not more than 2 nm and more preferably to at least 0.5 nm and not more than 1 nm, in order to improve the output characteristic of the photovoltaic element.

Figure 8:
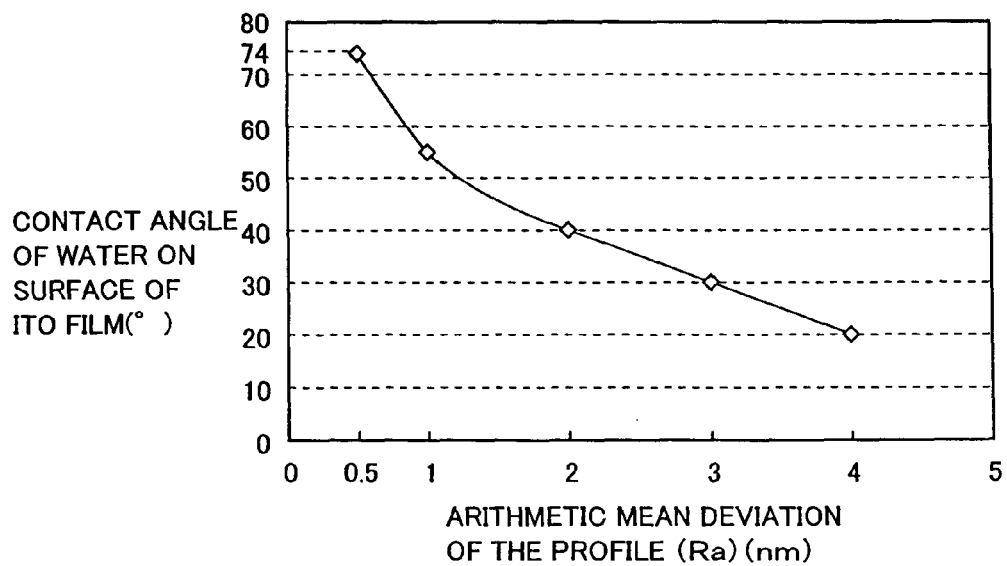
FIG. 8 is a correlation diagram showing the relation between the arithmetic mean deviation of the profile (Ra) of the ITO film and a contact angle of water on the surface of the ITO film.
Figure 9:
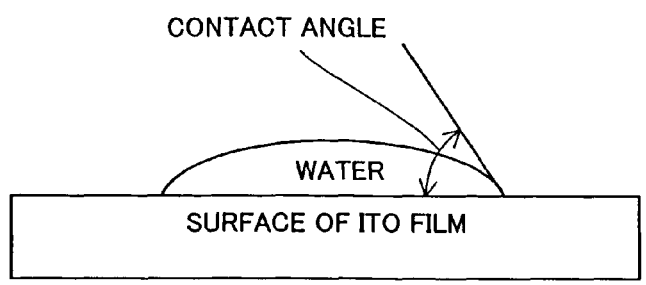
FIG. 9 is a model diagram for illustrating a method of measuring the contact angle of water on the surface of the ITO film.

FIG. 8 shows the relation between the arithmetic mean deviation of the profile (Ra) of the ITO film and the contact angle of water on the surface of the ITO film. Referring to FIG. 8, the contact angle of water on the surface of the ITO film was obtained by drawing a tangential line from the contact point of a water droplet placed on the surface of the ITO film and the surface of the ITO film to the surface of the water droplet and thereafter measuring the angle between the tangential line and the surface of the ITO film, as shown in FIG. 9. Referring to FIG. 8, it is understood that the contact angle of water on the surface of the ITO film is gradually increased from 20° to 74° as the arithmetic mean deviation of the profile (Ra) of the ITO film is reduced from 4 nm to 0.5 nm. In other words, it is understood that wettability on the surface of the ITO film is reduced as the arithmetic mean deviation of the profile (Ra) of the ITO film is reduced. When the wettability on the surface of the ITO film is reduced, the number of hydrogen bonds formed between epoxy resin contained in silver paste and water adsorbed to the surface of the ITO film when the silver paste is hardened is reduced. Thus, the adhesiveness of the paste electrode to the ITO film is conceivably reduced as the arithmetic mean deviation of the profile (Ra) of the ITO film is reduced. It has been proved from FIG. 8 that the contact angle of water on the surface of the ITO film is at least about 40° and not more than about 74° when the arithmetic mean deviation of the profile (Ra) of the ITO film preferable for improving the output characteristic of the photovoltaic element is in the range of at least about 0.5 nm to not more than about 2 nm. This means that an excellent output characteristic can be obtained when the contact angle of water on the surface of the ITO film is at least about 40° and not more than about 74°.

Figure 10:
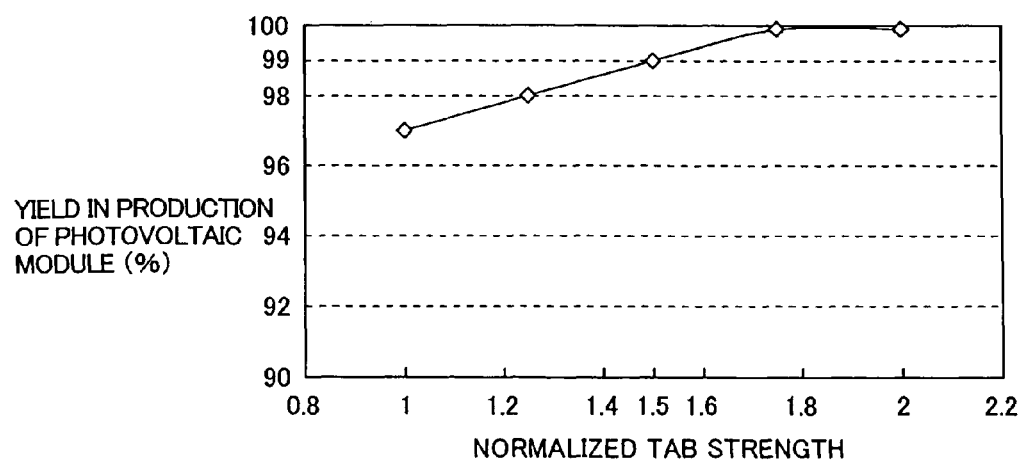
FIG. 10 is a correlation diagram showing the relation between normalized tab strength and the yield in production of the photovoltaic module.
Figure 11:
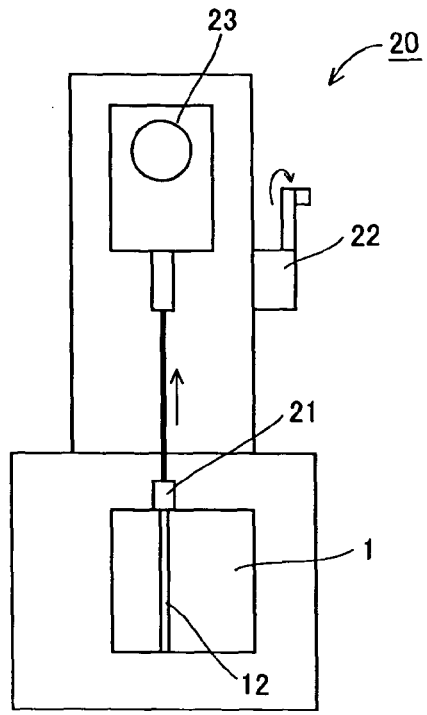
FIG. 11 is a diagram for illustrating a method of measuring the normalized tab strength.

FIG. 10 shows the relation between tab strength and the yield in production of a photovoltaic module. The term "tab strength" indicates peel strength necessary for peeling a tab of copper foil soldered to the paste electrode of the photovoltaic element. This tab strength indexes the adhesiveness of the paste electrode with respect to the ITO film. In measurement of the tab strength, a photovoltaic element 1 is fixed to a peel strength measuring device 20 and a tab 12 soldered onto a paste electrode 6 (see FIG. 1) of the photovoltaic element 1 is held with a clip 21 of the peel strength measuring device 20, as shown in FIG. 11. Thereafter a handle 22 of the peel strength measuring device 20 is so turned as to pull the clip 21 until the tab 12 and the paste electrode 6 (see FIG. 1) separate from the photovoltaic element 1. The maximum value of peel strength displayed on a gauge 23 of the peel strength measuring device 20 is measured thereby measuring the tab strength.

Referring to FIG. 10, it is understood that the yield in production of the photovoltaic module is gradually improved from 97% to 99.8% as the normalized tab strength is increased from 1 to 2. This is conceivably for the following reason: As the normalized tab strength is increased, the tab and the paste electrode hardly separate from the ITO film. Thus, the tab and the paste electrode are inhibited from separating from the photovoltaic element due to external force applied to the paste electrode through the tab in transportation of the photovoltaic element connected with another one through the tab or a pressure applied to the paste electrode when the photovoltaic element connected with another one through the tab and a back surface protective member are heated and pressurized. Consequently, formation of defectives is conceivably so suppressed that the yield in production of the photovoltaic module is improved. It is also understood from FIG. 10 that the yield in production of the photovoltaic module exceeds 99% when the normalized tab strength is at least 1.5.

Figure 12:
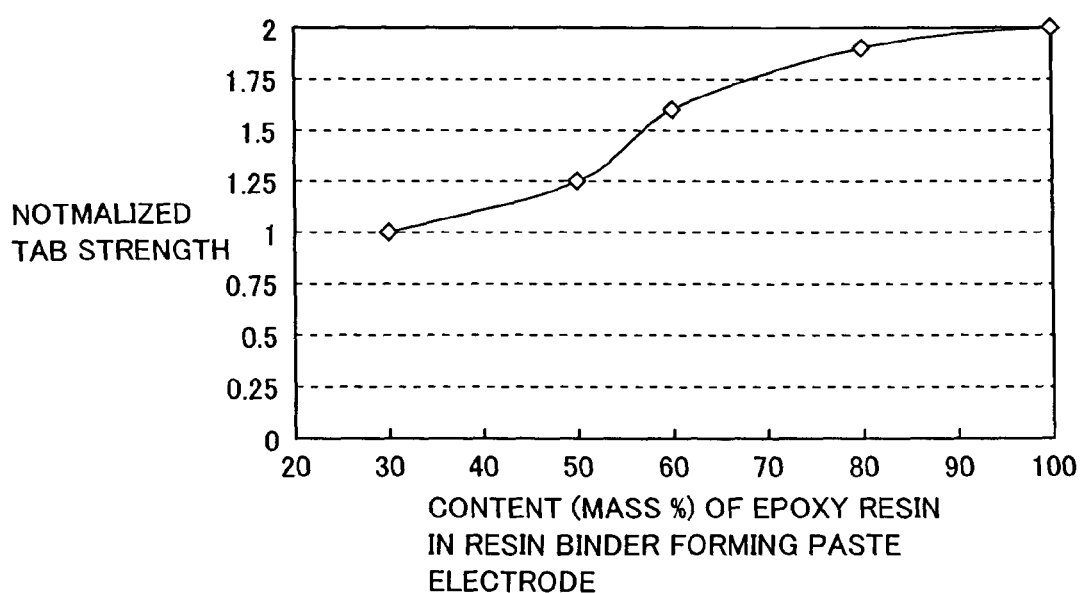
FIG. 12 is a correlation diagram showing the relation between the content of epoxy resin in a resin binder of a paste electrode and the normalized tab strength.

FIG. 12 shows the relation between the content of the epoxy resin in the resin binder forming the paste electrode and the tab strength in a case of setting the arithmetic mean deviation of the profile (Ra) of the ITO film to 2 nm. Referring to FIG. 12, the normalized tab strength is normalized by the tab strength when the content of the epoxy resin in the resin binder forming the paste electrode is 30 percent by weight (urethane resin content: 70 percent by weight). The remaining part of the resin binder is entirely prepared from urethane resin. Referring to FIG. 12, it is understood that the normalized tab strength is gradually increased from 1 to 2 as the content of the epoxy resin in the resin binder forming the paste electrode is increased from 30 percent to 100 percent. This is conceivably because the normalized tab strength is increased as the content of the epoxy resin is increased due to the adhesive strength of the epoxy resin with respect to the ITO film larger than that of the urethane resin. Assuming that the criterial normalized tab strength for non-defectives (yield of at least 99% in production of the photovoltaic module) is at least 1.5, it is understood that the content of the epoxy resin in the resin binder satisfies this criterion for non-defectives when the same is at least 60 percent by weight. Thus, it has been proved that the content of the epoxy resin in the resin binder forming the paste electrode is preferably at least 60 percent by weight (not more than 100 percent by weight) when the arithmetic mean deviation of the profile (Ra) of the ITO film is 2 nm.

Figure 13:
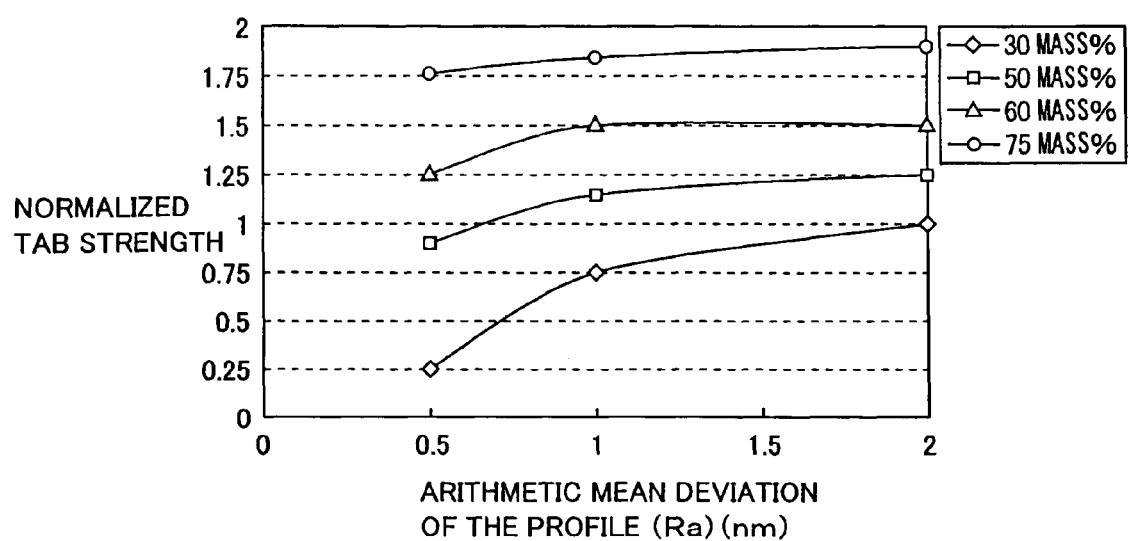
FIG. 13 is a correlation diagram showing the relation between the arithmetic mean deviation of the profile (Ra) of the ITO film and the normalized tab strength.

FIG. 13 shows the relation between the arithmetic mean deviation of the profile (Ra) of the ITO film and the tab strength with variation of the content of the epoxy resin in the resin binder forming the paste electrode. Referring to FIG. 13, the normalized tab strength is normalized by the tab strength when the content of the epoxy resin in the resin binder is 30 percent by weight (urethane resin content: 70 percent by weight). It is understood from FIG. 13 that the normalized tab strength is increased as the content of the epoxy resin in the resin binder forming the paste electrode is gradually increased from 30 percent by weight to 75 percent by weight. It is also understood that the normalized tab strength exceeds 1.5 if the content of the epoxy resin in the resin binder forming the paste electrode is at least 60 percent by weight while the normalized tab strength exceeds 1.75 if the content of the epoxy resin is at least 75 percent by weight when the arithmetic mean deviation of the profile (Ra) of the ITO film is at least 1 nm and not more than 2 nm. It is further understood that normalized tab strength of at least 1.75 is obtained if the content of the epoxy resin in the resin binder forming the paste electrode is at least 75 percent by weight when the arithmetic mean deviation of the profile (Ra) is a smaller value of at least 0.5 nm and not more than 1 nm. It has been proved from these results that the content of the epoxy resin in the resin binder forming the paste electrode is preferably at least 75 percent by weight (not more than 100 percent by weight) when the arithmetic mean deviation of the profile (Ra) of the ITO film is in the smaller range of at least 0.5 nm and not more than 1 nm.

Although the present invention has been described and illustrated in detail, it is clearly understood that the same is by way of illustration and example only and is not to be taken by way of limitation, the spirit and scope of the present invention being limited only by the terms of the appended claims.

For example, while the above embodiment has been described with reference to the photovoltaic element 1 having the n-type single-crystalline silicon substrate 2 formed thereon with the substantially intrinsic i-type amorphous silicon layer 3 and the p-type amorphous silicon layer 4, the present invention is not restricted to this but is widely applicable to a photovoltaic element including a transparent conductive oxide film and a paste electrode.

While the above embodiment has been described with reference to the photovoltaic element 1 formed with the BSF structure on the lower surface of the n-type single-crystalline silicon substrate 2, the present invention is not restricted to this but is also applicable to a photovoltaic element formed with no BSF structure.

While the above embodiment has been described with reference to the photovoltaic element 1 formed with the transparent conductive oxide films consisting of the ITO films 5 and 9, the present invention is not restricted to this but effects similar to those of the present invention can be attained also when transparent conductive oxide films consisting of a material other than ITO are formed on a photovoltaic element.

While the paste electrodes (silver paste) 6 and 9 containing silver (Ag) as the metal material are employed in the aforementioned embodiment, the present invention is not restricted to this but is also applicable to paste electrodes containing another metal material other than silver (Ag).

What is claimed is:

1. A photovoltaic device comprising a photovoltaic element, the photovoltaic element comprising:
   a first conductivity type single crystalline silicon semiconductor layer;
   a substantially intrinsic non-single-crystalline semiconductor layer formed on the first conductivity type single crystalline silicon semiconductor layer;
   a transparent conductive oxide film formed on the substantially intrinsic non-single-crystalline semiconductor layer, wherein said transparent conductive oxide film contains $SnO_2$-added $In_2O_3$ with the content of Sn not more than 5 percent by weight, has an arithmetic mean deviation of the profile (Ra) of at least about 0.5 nm and not more than 2 nm, and has a surface with respect to which a contact angle of water is at least about 40° C. and not more than about 74° C.;
   a paste electrode formed on the transparent oxide film, wherein the paste electrode contains a metal material and a resin binder, the resin binder containing at least about 60 percent by weight and not more than about 80 percent by weight of epoxy resin; and
   an electric wire connected to the paste electrode by solder, wherein a surface of the transparent conductive oxide film has irregularities with a height, and wherein a surface of the first conductivity type single crystalline silicon semiconductor layer has irregularities higher than the height of the irregularities on the surface of the transparent conductive oxide film,
   the resin binder consists of urethane resin and the epoxy resin.

2. The photovoltaic device according to claim 1, wherein said photovoltaic element includes a second conductivity type non-single-crystalline semiconductor layer formed on said substantially intrinsic non-single-crystalline semiconductor layer, and
   said transparent conductive oxide film is formed on said second conductivity type non-single-crystalline semiconductor layer.

3. The photovoltaic device according to claim 1, wherein said substantially intrinsic non-single-crystalline semiconductor layer includes a substantially intrinsic first non-single-crystalline semiconductor layer formed on the upper surface of said first conductivity type single crystalline silicon semiconductor layer and a substantially intrinsic second non-single-crystalline semiconductor layer formed on the lower surface of said first conductivity type single crystalline silicon semiconductor layer,
   said photovoltaic element includes a second conductivity type third non-single-crystalline semiconductor layer formed on the upper surface of said first non-single-crystalline semiconductor layer and a first conductivity type fourth non-single-crystalline semiconductor layer formed on the lower surface of said second non-single-crystalline semiconductor layer, and
   said transparent conductive oxide film includes a first transparent conductive oxide film formed on the upper surface of said third non-single-crystalline semiconductor layer and a second transparent conductive oxide film formed on the lower surface of said fourth non-single-crystalline semiconductor layer.

4. The photovoltaic device according to claim 1, wherein said transparent conductive oxide film has arithmetic mean deviation of the profile of at least about 0.5 nm and not more than about 1 nm.

5. The photovoltaic device according to claim 1, wherein said metal material constituting said paste electrode is Ag.

6. The photovoltaic device according to claim 1, wherein a plurality of said photovoltaic elements are provided at a prescribed interval, and
   said paste electrode includes a first paste electrode formed on the upper surface of each said photovoltaic element and a second paste electrode formed on the lower surface of each said photovoltaic element,
   wherein the electric wire has a first end connected to said first paste electrode formed on the upper surface of prescribed said photovoltaic element and a second end connected to said second paste electrode formed on the lower surface of another said photovoltaic element adjacent to said prescribed photovoltaic element.

* * * * *